(12) United States Patent
Yang

(10) Patent No.: US 11,004,863 B2
(45) Date of Patent: May 11, 2021

(54) NON-VOLATILE MEMORY WITH GATE ALL AROUND THIN FILM TRANSISTOR AND METHOD OF MANUFACTURING THE SAME

(71) Applicant: MACRONIX International Co., Ltd., Hsinchu (TW)

(72) Inventor: Zusing Yang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/557,803

(22) Filed: Aug. 30, 2019

(65) Prior Publication Data

US 2021/0066334 A1 Mar. 4, 2021

(51) Int. Cl.
*H01L 27/11582* (2017.01)
*H01L 29/786* (2006.01)
(Continued)

(52) U.S. Cl.
CPC .. *H01L 27/11582* (2013.01); *H01L 21/31144* (2013.01); *H01L 27/1157* (2013.01);
(Continued)

(58) Field of Classification Search
CPC ... H01L 21/31144; H01L 21/71; H01L 21/74; H01L 21/768; H01L 21/76837; H01L 21/76838; H01L 21/76841; H01L 21/76843; H01L 21/7685; H01L 21/76852; H01L 21/76877; H01L 27/105; H01L 27/108; H01L 27/112; H01L 27/115; H01L 27/11524; H01L 27/11556; H01L 27/1157;
(Continued)

(56) References Cited

U.S. PATENT DOCUMENTS

2016/0276264 A1* 9/2016 Noda ............... H01L 27/11519
2017/0062456 A1* 3/2017 Sugino ............... H01L 27/1157
2020/0083245 A1* 3/2020 Fayrushin ........... H01L 29/7926

FOREIGN PATENT DOCUMENTS

TW 201906161 2/2019
TW I668846 8/2019

OTHER PUBLICATIONS

"Office Action of Taiwan Counterpart Application", dated Jun. 15, 2020, p. 1-p. 4.

* cited by examiner

*Primary Examiner* — Cheung Lee
(74) *Attorney, Agent, or Firm* — J.C. Patents

(57) ABSTRACT

A non-volatile memory having a gate all around thin film transistor includes a multi-layer structure, an elongated plug structure, a first conductive plug, and a second conductive plug. The multi-layer structure includes a plurality of gate electrode layers stacked on a substrate separately from each other. The elongated plug structure penetrates through the multi-layer structure, and a cross-section of the elongated plug structure has an elongated contour. The elongated plug structure includes an insulating pillar, a channel layer, and a gate dielectric layer. The channel layer surrounds the insulating pillar. The gate dielectric layer surrounds the channel layer. The gate electrode layers surround the gate dielectric layer. The first conductive plug is disposed between the channel layer and the substrate and between the insulating pillar and the substrate. The second conductive plug is disposed on the insulating pillar and is covered by the channel layer.

13 Claims, 13 Drawing Sheets

(51) Int. Cl.
*H01L 29/423* (2006.01)
*H01L 21/311* (2006.01)
*H01L 27/1157* (2017.01)

(52) U.S. Cl.
CPC .... *H01L 29/4234* (2013.01); *H01L 29/42392* (2013.01); *H01L 29/78642* (2013.01); *H01L 29/78696* (2013.01)

(58) Field of Classification Search
CPC ............. H01L 27/11582; H01L 29/401; H01L 29/40117; H01L 29/42328; H01L 29/4234; H01L 29/42392; H01L 29/78642; H01L 29/78696; H01L 29/788; H01L 29/792
See application file for complete search history.

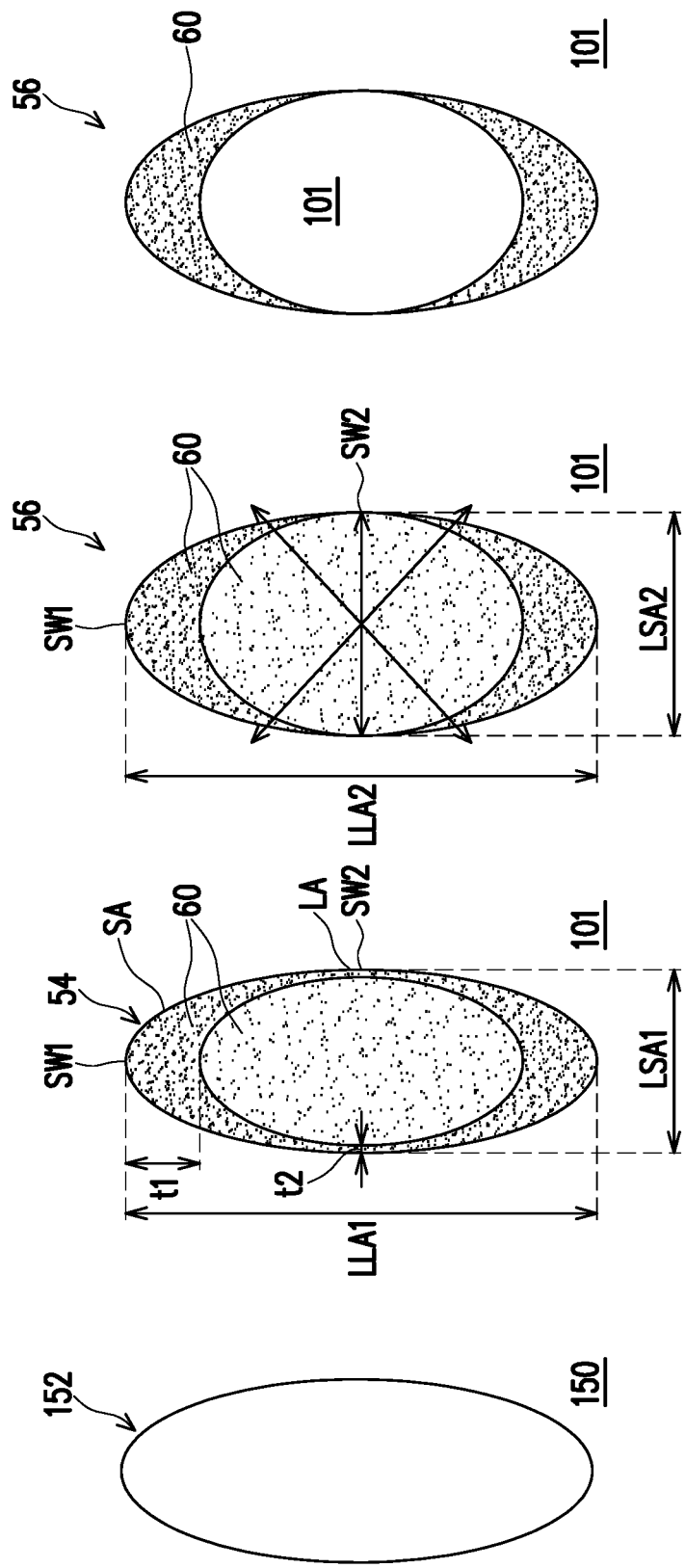

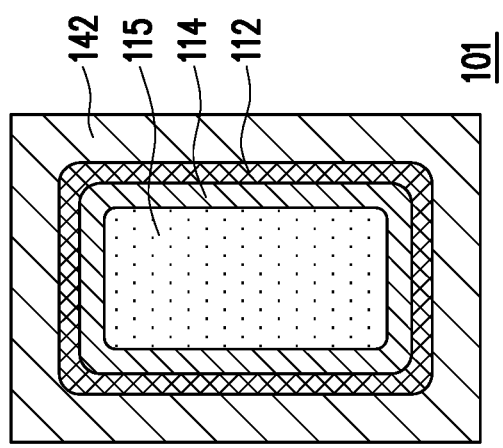
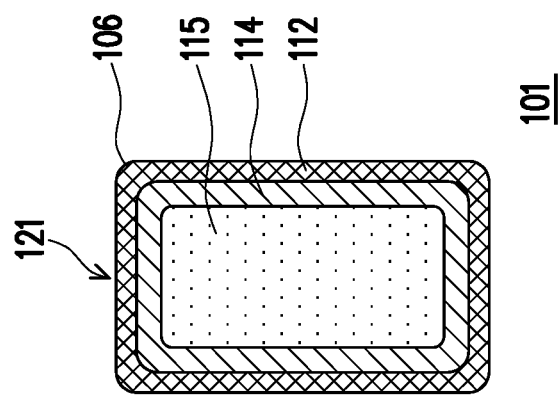
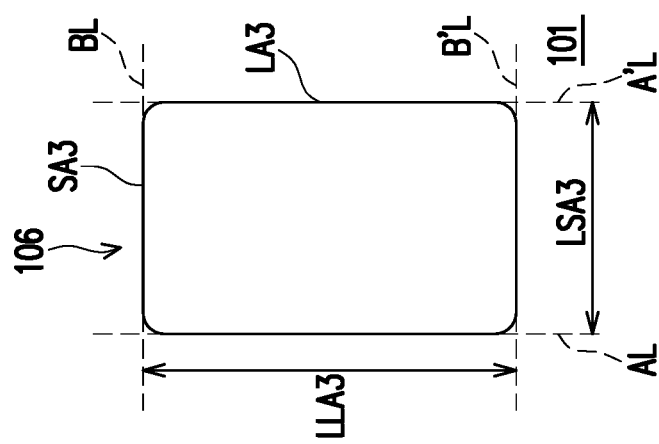

NON-VOLATILE MEMORY WITH GATE ALL AROUND THIN FILM TRANSISTOR AND METHOD OF MANUFACTURING THE SAME

BACKGROUND OF THE INVENTION

Field of the Invention

The disclosure relates to a memory and a method of manufacturing the same, and more particularly, to a non-volatile memory having a gate all around thin film transistor and a method of manufacturing the same.

Description of Related Art

With the characteristics that stored data are safeguarded even after power is turned off, the non-volatile memory devices (e.g., a flash memory) have become a memory device that is commonly adopted in personal computers and other electronic devices.

Flash memory arrays commonly used in the industry include NOR flash memories and NAND flash memories. Since memory cells are connected in series in the structure of the NAND flash memory, the level of integration and the area utilization of the NAND flash memory are more efficient. Therefore, NAND flash memories have been widely used in various electronic products, especially in the mass data storage field.

In order to further increase the level of storage density as well as integration of the memory device, a three-dimensional NAND flash memory has been developed. However, the current three-dimensional NAND flash memory technique is faced with issues such as insufficient electric field effect, a small memory window, and a wide distribution of the threshold voltage (Vt).

SUMMARY OF THE INVENTION

The embodiments of the disclosure provide a three-dimensional non-volatile memory and a method of manufacturing the same, which can improve the electric field enhancement effect, improve the memory window, and narrow the distribution of the threshold voltage (Vt).

An embodiment of the disclosure provides a non-volatile memory having a gate all around thin film transistor, including a multi-layer structure, an elongated plug structure, a first conductive plug, and a second conductive plug. The multi-layer structure includes a plurality of gate electrode layers stacked on a substrate separately from each other. The multi-layer structure has a hole therein. The hole penetrates through the multi-layer structure. A cross-section of the hole has an elongated contour. The elongated contour has a long side and a short side. A long-side length and a short-side length are different. The elongated plug structure is disposed in the hole. The elongated plug structure includes an insulating pillar, a channel layer, and a gate dielectric layer. The insulating pillar is disposed on the substrate. The channel layer is disposed on the substrate and surrounds the insulating pillar. The gate dielectric layer surrounds the channel layer. The gate electrode layers surround the gate dielectric layer. The first conductive plug is disposed between the channel layer and the substrate and between the insulating pillar and the substrate. The second conductive plug is disposed on the insulating pillar and is covered by the channel layer.

An embodiment of the disclosure provides a method of manufacturing a non-volatile memory having a gate all around thin film transistor, including the following steps. A stacked structure is formed on a substrate. A mask layer is formed on the stacked structure. The mask layer has a first opening having a cross-section of an elliptical shape. A plurality of cycle etching processes are performed on the stacked structure with the mask layer as an etching mask to form a second opening of a cross-section having an elongated contour, and the elongated contour has a long side and a short side of different lengths. Performing each cycle etching process includes performing an etching process and performing a cleaning process. The performing the etching process includes performing a first-stage etching process on the stacked structure to form a first hole in the stacked structure, and forming a polymer on a sidewall and a bottom surface of the first hole. A thickness of the polymer formed at the sidewall of a short-side position of the first hole is greater than a thickness of the polymer formed at the sidewall of a long-side position of the first hole. The performing the etching process further includes performing a second-stage etching process on the first hole to form a second hole. A short-side length of the second hole is greater than a short-side length of the first hole. The cleaning process is performed to remove the polymer on a bottom surface of the second hole.

In the embodiments of the disclosure, through the control of the cycle etching process, an opening of a cross-section having an elongated contour may be formed in the stacked structure. Accordingly, the gate dielectric layer (charge storage layer) and the gate electrode layer may be constructed to have an elongated contour to improve the electric field enhancement effect of the transistor. As a result, it is possible to increase the programming and erasing window and narrow the distribution of the threshold voltage (Vt).

To make the aforementioned more comprehensible, several embodiments accompanied with drawings are described in detail as follows.

BRIEF DESCRIPTION OF THE DRAWINGS

FIG. 3A to FIG. 3G are top views showing a manufacturing process of forming a three-dimensional non-volatile memory. FIG. 3E, FIG. 3F, and FIG. 3G respectively top views taken along sectional line I-I' in FIG. 1B, FIG. 1C, and FIG. 1F.

DESCRIPTION OF THE EMBODIMENTS

FIG. 1A to FIG. 1G are cross-sectional views showing a manufacturing process of a three-dimensional non-volatile memory according to some embodiments of the disclosure.

Figure 2:
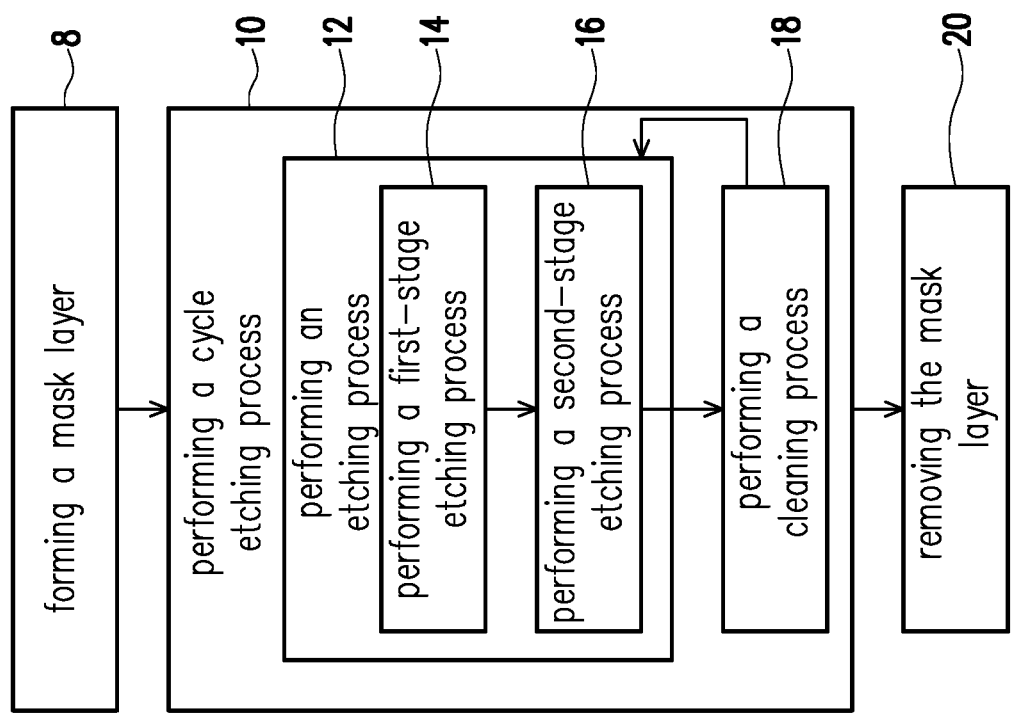
FIG. 2 is a flowchart showing steps of forming an opening according to some embodiments of the disclosure.

FIG. 2 is a flowchart showing steps of forming an opening according to some embodiments of the disclosure. FIG. 3A to FIG. 3G are top views showing a manufacturing process of forming a three-dimensional non-volatile memory.

Figure 1A:
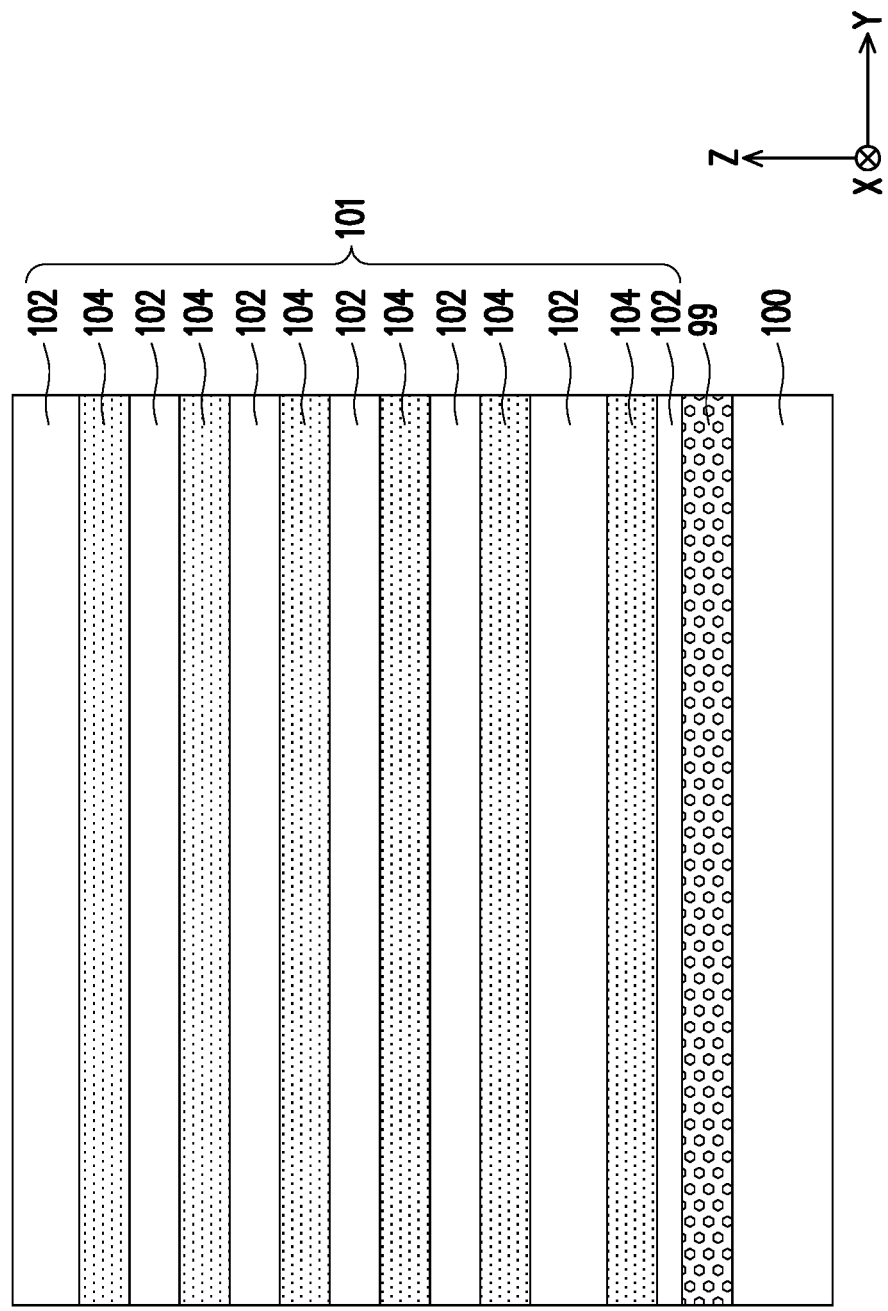
FIG. 1A to FIG. 1G are cross-sectional views showing a manufacturing process of a three-dimensional non-volatile memory according to some embodiments of the disclosure.

Referring to FIG. 1A, a stacked structure 101 is formed on a substrate 100. The substrate 100 is, for example, a silicon substrate. In some embodiments, a doped region (e.g., an N+ doped region or an N-type well region) 99 may be formed in the substrate 100 according to the design requirements. The stacked structure 101 includes a plurality of insulating material layers 102 and a plurality of sacrifice layers 104 which are alternately stacked. The material of the insulating material layer 102 includes a dielectric material, such as silicon oxide. The material of the sacrifice layer 104 is different from the insulating material layer 102 and exhibits a sufficient etching selectivity with respect to the insulating material layer 102. In some embodiments, the material of the sacrifice layer 104 is, for example, silicon nitride. The insulating material layers 102 and the sacrifice layers 104 are formed by performing a chemical vapor deposition process multiple times, for example. The number of layers of the insulating material layers 102 and the number of layers of the sacrifice layers 104 in the stacked structure 101 may be respectively greater than 16 and may be 56, 64, or 96, for example. However, the disclosure is not limited thereto. The numbers of layers of the insulating material layers 102 and the sacrifice layers 104 in the stacked structure 101 may be determined by the design and the density of a memory device.

Figure 1B:
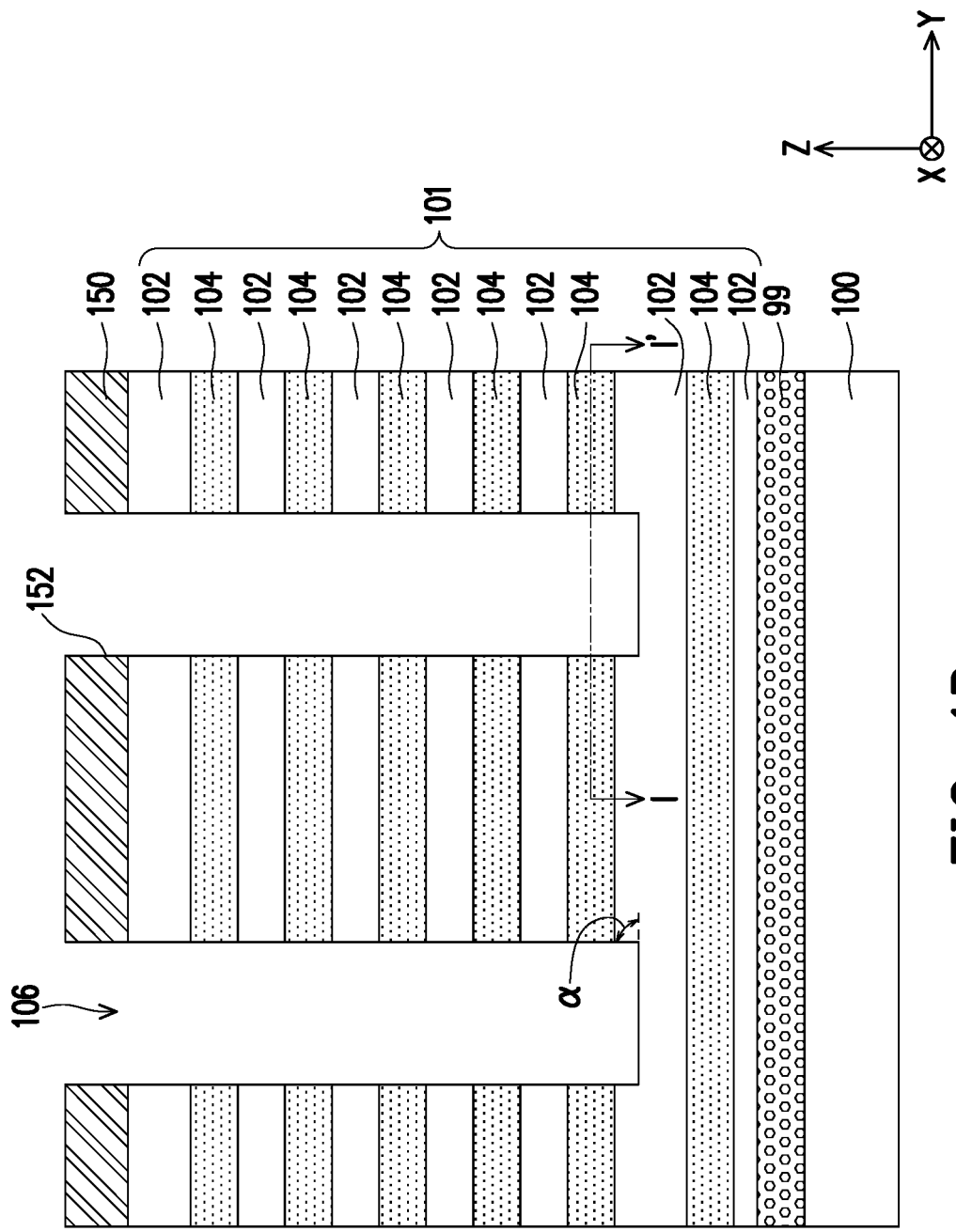

Next, referring to FIG. 1B and FIG. 2, step 8 is performed to form a mask layer 150 on the stacked structure 101. The mask layer 150 has an opening 152. The opening 152 has an elliptical contour (as shown in FIG. 3A). Afterwards, by using the mask layer 150 as a mask, a plurality of cycle etching processes 10 are performed on the stacked structure 101 to form an opening 106 (or referred to as a hole) in the stacked structure 101. In the present embodiment, the opening 106 does not penetrate through the entire stacked structure 101. The bottom surface of the opening 106 exposes the insulating material layer 102 of the stacked structure 101. In other embodiments, the opening 106 penetrates through the entire stacked structure 101, and the bottom surface of the opening 106 exposes the substrate 100. Moreover, in FIG. 1B, the opening 106 has a vertical sidewall, and a base angle α of the opening 106 is a right angle. However, in other embodiments, the opening 106 may have an inclined sidewall, and the base angle α of the opening 106 may be an acute angle, such as 85 degrees to 89 degrees. In other words, the width of the opening 106 gradually decreases from the top surface of the stacked structure 101 toward the bottom surface of the stacked structure 101.

Referring to FIG. 1B and FIG. 2, in the present embodiment, each cycle etching process 10 includes an etching process 12 and a cleaning process 18. The etching process 12 includes a first-stage etching process 14 and a second-stage etching process 16. The first-stage etching process 14 and the second-stage etching process 16 both etch the stacked structure 101 by using the mask layer 150 as the mask. FIG. 3A shows the contour of the opening 152 of the mask layer 150. FIG. 3B to FIG. 3E show the contour of hole in each stage in the cycle etching process of forming the opening 106.

Referring to FIG. 1B, FIG. 2, FIG. 3A, and FIG. 3B, the first-stage etching process 14 is performed on the stacked structure 101 by using the mask layer 150 as the mask to etch a first hole 54 having an elliptical shape in the stacked structure 101. In the first-stage etching process 14, a polymer 60 is meanwhile formed on the sidewall and the bottom surface of the first hole 54. After the first-stage etching process 14 is performed, a thickness t1 of the polymer 60 formed at a sidewall SW1 of a short-side position SA of the first hole 54 is greater than a thickness t2 of the polymer 60 formed at a sidewall SW2 of a long-side position LA of the first hole 54. In some embodiments, the thickness of the polymer 60 is in a gradient decrease from the thickness t1 at the sidewall SW1 of the short-side position SA of the first hole 54 to the thickness t2 at the sidewall SW2 of the long-side position LA of the first hole 54. The first-stage etching process 14 may be an anisotropic etching process, such as a reactive ion etching process. The etching gas used in the first-stage etching process 14 includes a first hydrocarbon, oxygen, and argon. The first hydrocarbon may be an unsubstituted, partially fluorine-substituted, or perfluoro C1 to C4 alkane, alkene, or alkyne, such as $CH_4$, $CF_4$, $C_4F_8$, $C_4F_6$, or a combination thereof. The time for performing the first-stage etching process 14 is, for example, 80 seconds to 160 seconds.

Referring to FIG. 1, FIG. 2, FIG. 3B, and FIG. 3C, the second-stage etching process 16 is performed to expand the first hole 54 to form a second hole 56 of a cross-section having an elongated contour. Since the thickness t2 of the polymer 60 formed at the sidewall SW2 is less than the thickness t1 of the polymer 60 formed at the sidewall SW1, in the second-stage etching process 16, when the polymer 60 at the sidewall SW2 is fully removed and the stacked structure 101 is exposed, although the polymer 60 at the sidewall SW1 is lost, the sidewall SW1 is still covered by the polymer 60. Therefore, the stacked structure 101 at the sidewall SW2 is exposed first and etched earlier than the stacked structure 101 at the sidewall SW1, while the stacked structure 101 at the sidewall SW1 is protected by the polymer 60 and is thus not etched or is etched only in a small amount. As a result, after the second-stage etching process 16 is performed, a short-side length LSA2 of the second hole 56 will be greater than a short-side length LSA1 of the first hole 54, and a long-side length LLA2 of the second hole 56 will be equal to or slightly greater than a long-side length LLA1 of the first hole 54. In other words, a difference ΔLSA between the short-side length LSA2 of the second hole 56 and the short-side length LSA1 of the first hole 54 is greater than a difference ΔLLA between the long-side length LLA2 of the second hole 56 and the long-side length LLA1 of the first hole 54.

The second-stage etching process 16 may be an anisotropic etching process, such as a reactive ion etching process. The etching gas used in the second-stage etching process 16 includes a second hydrocarbon and $NF_3$. The second hydrocarbon may be a partially fluorine-substituted C1 to C4 alkane, alkene, or alkyne, such as $CH_3F$, $C_4F_6$, $CH_2F_2$, or a combination thereof. In some embodiments, the carbon number of the first hydrocarbon used in the first-stage etching process 14 is greater than the carbon number of the second hydrocarbon used in the second-stage etching process 16. In other words, the first hydrocarbon used in the first-stage etching process 14 is more likely to produce a polymer than the second hydrocarbon used in the second-stage etching process 16. The time for performing the second-stage etching process 16 is two to four times the time for performing the first-stage etching process 14. The time for performing the second-stage etching process 16 is, for example, 240 seconds to 320 seconds. The total time of the second-stage etching process 16 and the first-stage etching process 14 is, for example, 320 seconds to 400 seconds.

Referring to FIG. 1B, FIG. 2, and FIG. 3D, the cleaning process 18 is performed to remove the polymer 60 deposited on the bottom surface of the second hole 56 to expose the unetched stacked structure 101 under the second hole 56. The etching gas used in the cleaning process 18 includes a third hydrocarbon and $O_2$. The third hydrocarbon may be a fluorine-substituted C1 to C4 alkane, such as $CF_4$, $CH_2F_2$, $C_4F_6$, or a combination thereof. The time for performing the cleaning process 18 is less than the time of the first-stage etching process 14 and is less than the time of the second-stage etching process 16. The time for performing the cleaning process 18 is, for example, 10 seconds to 15 seconds.

Referring to FIG. 1B, FIG. 2, and FIG. 3E, the above cycle process 10 is repeated multiple times to increase the depth of the second hole 56. In some cases, 6 to 25 cycles, or 6 to 50 cycles, are performed, for example.

Afterwards, referring to FIG. 2, step 20 is performed to remove the mask layer 150 and the remaining polymer 60 to expose the top surface of the topmost insulating material layer 102 of the stacked structure 101, the stacked structure 101 at the sidewall of the opening 106, and the insulating material layer 102 at the bottom of the opening 106, to form the opening 106 as shown in FIG. 1B. FIG. 3E is a top view taken along sectional line I-I' in FIG. 1B. The method of removing the mask layer 150 may be a dry etching process such as oxygen plasma. The method of removing the polymer 60 may be a wet etching method using, for example, a Caros® etching solution ($H_2SO_4$:$H_2O_2$=2:1, volume ratio) and an SC1® cleaning solution (ammonium hydroxide/hydrogen peroxide/deionized water).

Referring to FIG. 3A and FIG. 3E, the contour of the first hole 54 formed in the first-stage etching process 14 of the first cycle etching process 10 is substantially similar to the contour of the opening 152 of the mask layer 150. As the number of the cycle etching process increases, the depth of the hole (opening) formed in the stacked structure 101 gradually increases, and the difference between the contour of the bottom of the hole (opening) and the contour of the opening 152 of the mask layer 150 gradually increases. In some embodiments, the cross-sectional contour from the top to the bottom of the opening 106 is in an elongated shape, as shown in FIG. 3E. In other some embodiment, the cross-sectional contour at the top of the opening 106 is in an elliptical or ellipse-like shape. As the depth of the opening 106 increases, the ratio of the long-side length to the short-side length of the cross-sectional contour of the opening 106 gradually decreases, and the cross-sectional contour at the bottom of the opening 106 is in an elongated shape, as shown in FIG. 3E.

Referring to FIG. 3E, the cross-section of the opening 106 has an elongated contour. The elongated contour has a long side LA3 and a short side SA3. The long-side length LLA3 is greater than the short-side length LSA3. Here, the short-side length LSA3 refers to the maximum distance between tangent lines AL and A'L of the two long sides LA3. The long-side length LLA3 refers to the maximum distance between tangent lines BL and B'L of the two short sides SA3. The tangent lines AL and A'L are parallel to each other, the tangent lines BL and B'L are parallel to each other, and the tangent lines AL and A'L are perpendicular to the tangent lines BL and B'L.

Figure 4:
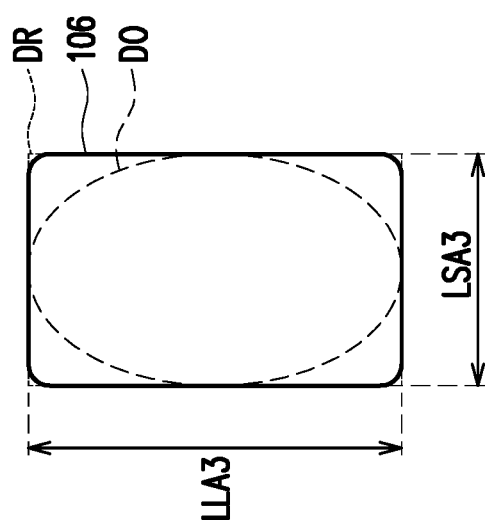
FIG. 4 is a schematic view showing an elongated opening, an inscribed ellipse opening of a reference opening, and a reference opening according to an embodiment of the disclosure.

Referring to FIG. 4, the cross-section of the bottom of the opening 106 has an elongated contour. The elongated contour satisfies Formula 1:

$A0 < A1 \leq A2$ <Formula 1> wherein

A1: represents the area of the opening 106 enclosed by the elongated contour;

A2: represents the area of a reference rectangle DR which has the long side LS3 and the short side SA3 of the opening 106; and A0: represents the area of a maximum inscribed ellipse DO in the reference rectangle.

In some embodiments, the ratio of the bottom area of the opening 106 to the area of its reference rectangle DR is in the range of 0.8 to 1. The bottom area of the opening 106 is in the range of 3,000 $nm^2$ to 20,000 $nm^2$. A short-side length LSA3 and a long-side length LLA3 of the opening 106 are in the range of 20 nm to 300 nm. The short-side length LSA3 of the opening 106 is, for example, in the range of 20 nm to 100 nm. The long-side length LLA3 of the opening 106 is, for example, in the range of 150 nm to 200 nm. The ratio of the short-side length LSA3 to the long-side length LLA3 of the opening 106 may be in the range of 0.1 to 1. The ratio of the short-side length LSA3 to the long-side length LLA3 of the opening 106 is, for example, in the range of 0.13 to 0.5. The opening 106 has an aspect ratio greater than 40, such as 40 to 96.

Figure 5D:
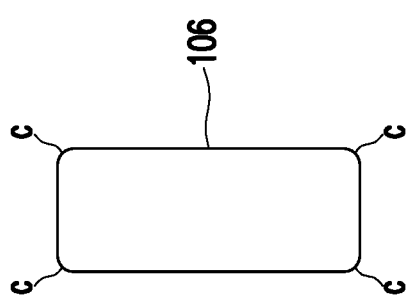
FIG. 5A to FIG. 5H are schematic views showing various openings having an elongated contour according to an embodiment of the disclosure.
Figure 5C:
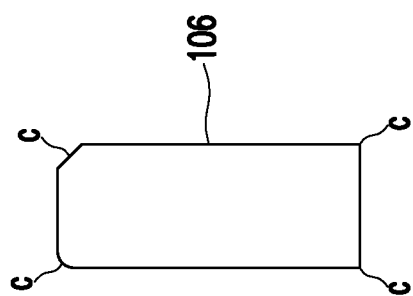
Figure 5B:
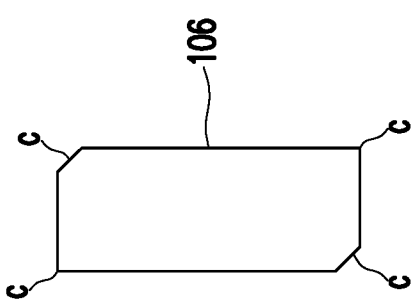
Figure 5A:
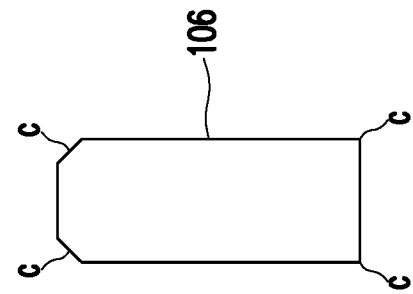
Figure 5H:
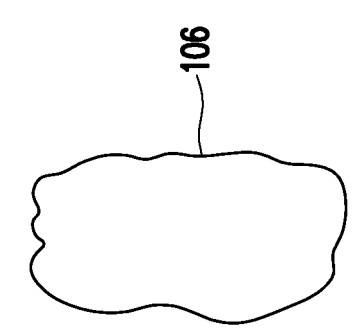
Figure 5G:
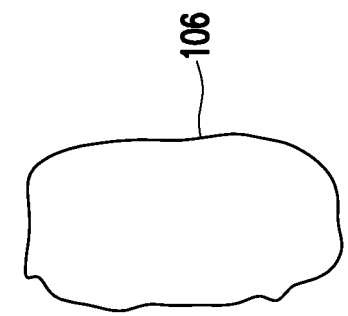
Figure 5F:
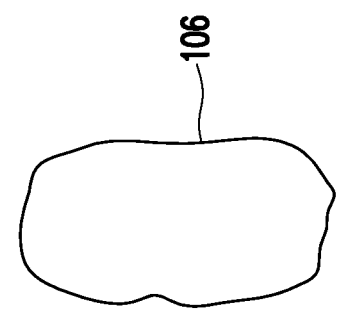
Figure 5E:
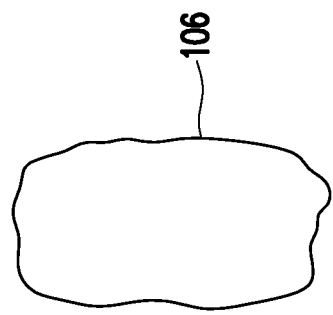

Referring to FIG. 5A to FIG. 5H, a vertex angle C of the opening 106 may be a round angle, a chamfer angle, or a right angle. The shapes of the respective vertex angles C of the opening 106 may be the same as or different from each other. The sides of the opening 106 may be straight (as shown in FIG. 5A to FIG. 5D) or slightly curved or wavy (as shown in FIG. 5E to FIG. 5H). The lengths of two corresponding sides of the opening 106 may be equal (as shown in FIG. 5A) or slightly different (as shown in FIG. 5B to FIG. 5H).

Figure 1C:
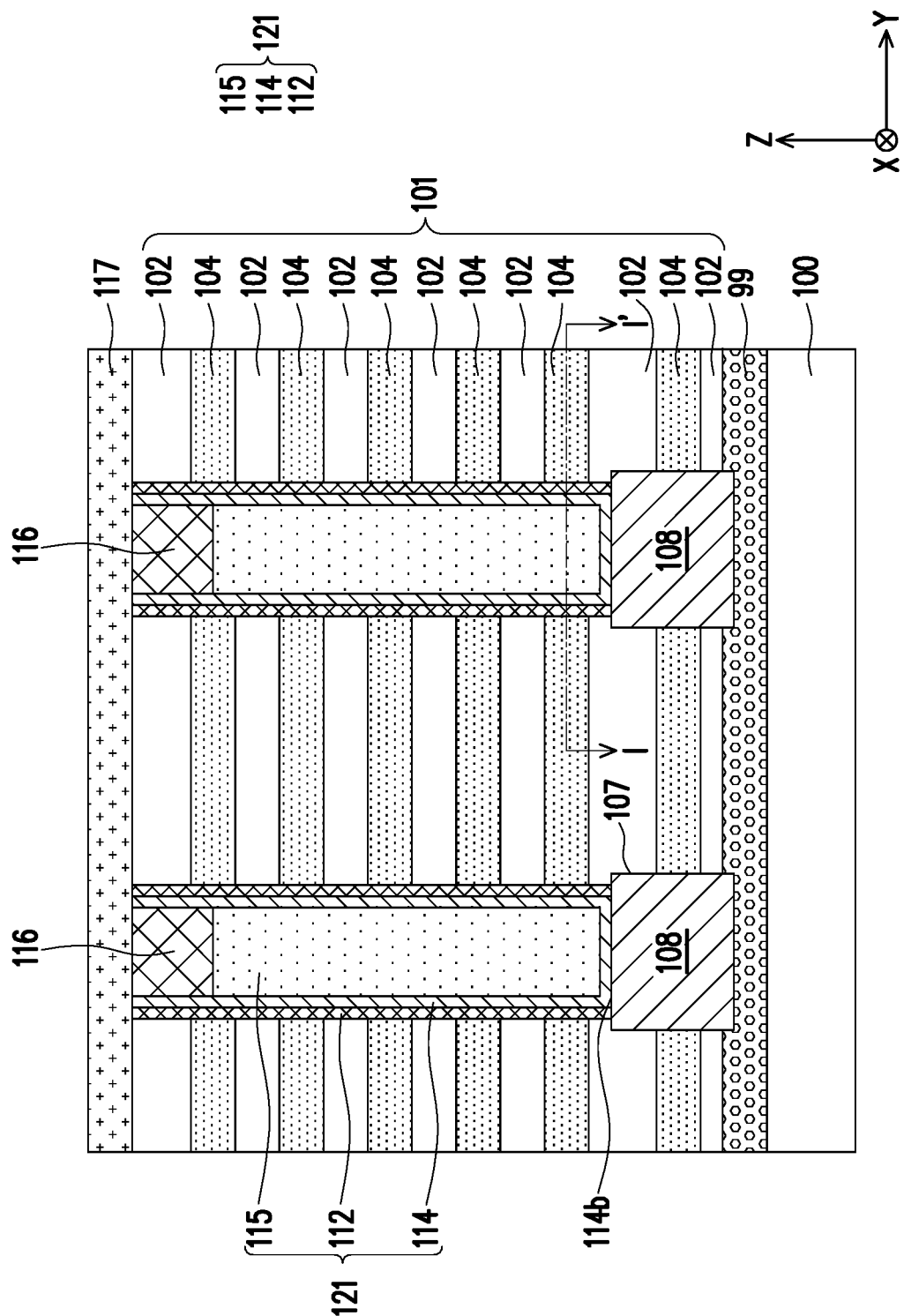

Referring to FIG. 1B, FIG. 1C, and FIG. 3F at the same time, a charge storage structure 112 is formed on the sidewall of the opening 106. The charge storage structure 112 may be a conformal layer which covers the insulating material layers 102 and the sacrifice layers 104 on the sidewall of the opening 106 according to the shape of the opening 106 and exposes the insulating material layer 102 on the bottom surface of the opening 106. In other words, the charge storage structure 112 and the opening 106 have substantially the same shape and contour. The charge storage structure 112 may be an oxide, a nitride, or a combination thereof. In some embodiments, the charge storage structure 112 includes an oxide-nitride-oxide (ONO) composite layer. In an exemplary embodiment, the charge storage structure 112 includes a silicon oxide layer, a silicon nitride layer, and a silicon oxide layer. In some embodiments, the charge storage structure 112 includes an oxide-nitride-oxide-nitride-oxide (ONONO) composite layer. In an exemplary embodiment, the charge storage structure 112 includes a silicon oxide layer, a silicon nitride layer, a silicon oxide layer, a silicon nitride layer, and a silicon oxide layer.

Next, referring to FIG. 1C, the insulating material layer 102 exposed on the bottom surface of the opening 106 is removed until the substrate 100 is exposed to form a contact opening 107. Afterwards, a conductive plug 108 is formed in the contact opening 107. The method of forming the conductive plug 108 includes epitaxial growth. The conductive plug 108 may be silicon, gallium arsenide, or silicon germanium.

Then, referring to FIG. 1C and FIG. 3F, a channel layer 114 is formed on the charge storage structure 112. Specifically, the channel layer 114 covers the charge storage structure 112 on the sidewall of the opening 106 and contacts the conductive plug 108. In some embodiments, the channel layer 114 may serve as a bit line. The material of the channel layer 114 is, for example, a semiconductor material, such as polysilicon or doped polysilicon. Doping may be carried out by performing an in-situ doping process or performing an ion implantation process. In some embodiments, after the channel layer 114 is formed, an annealing process is also performed. After the annealing process, a bottom portion 114b of the channel layer 114 crystallizes into a single crystal silicon and merges with the conductive plug 108. The conductive plug 108 may serve as a source contact and may be electrically connected to the doped region 99 in the substrate 100. The channel layer 114 may be a conformal layer and thus has substantially the same contour as the opening 106.

Referring to FIG. 1C and FIG. 3F, a dielectric layer 115 is formed in the opening 106. The dielectric layer 115 is formed by, for example, forming a dielectric material layer (not shown) filling up the opening 106 by chemical vapor deposition or spin coating, and then performing an etch back process on the dielectric material layer such that the upper surface of the formed dielectric layer 115 is lower than the top surface of the stacked structure 101. The dielectric layer 115 is substantially vertical to the surface of the substrate 100 and may also be referred to as an insulating pillar 115.

Next, a conductive plug 116 is formed on the dielectric layer 115. The conductive plug 116 contacts the channel layer 114. In some embodiments, the material of the conductive plug 116 is, for example, polysilicon or doped polysilicon. The conductive plug 116 is formed by, for example, first forming a conductive material layer (not shown) filling up the opening 106, and then performing a chemical mechanical polishing process and/or an etch back process on the conductive material layer to remove the conductive material layer outside the opening 106.

Afterwards, an insulating layer 117 is formed on the stacked structure 101. The insulating layer 117 covers the charge storage structure 112, the channel layer 114, the conductive plug 116, and the stacked structure 101. In some embodiments, the material of the insulating layer 117 is, for example, silicon oxide or other insulating materials.

Figure 1D:
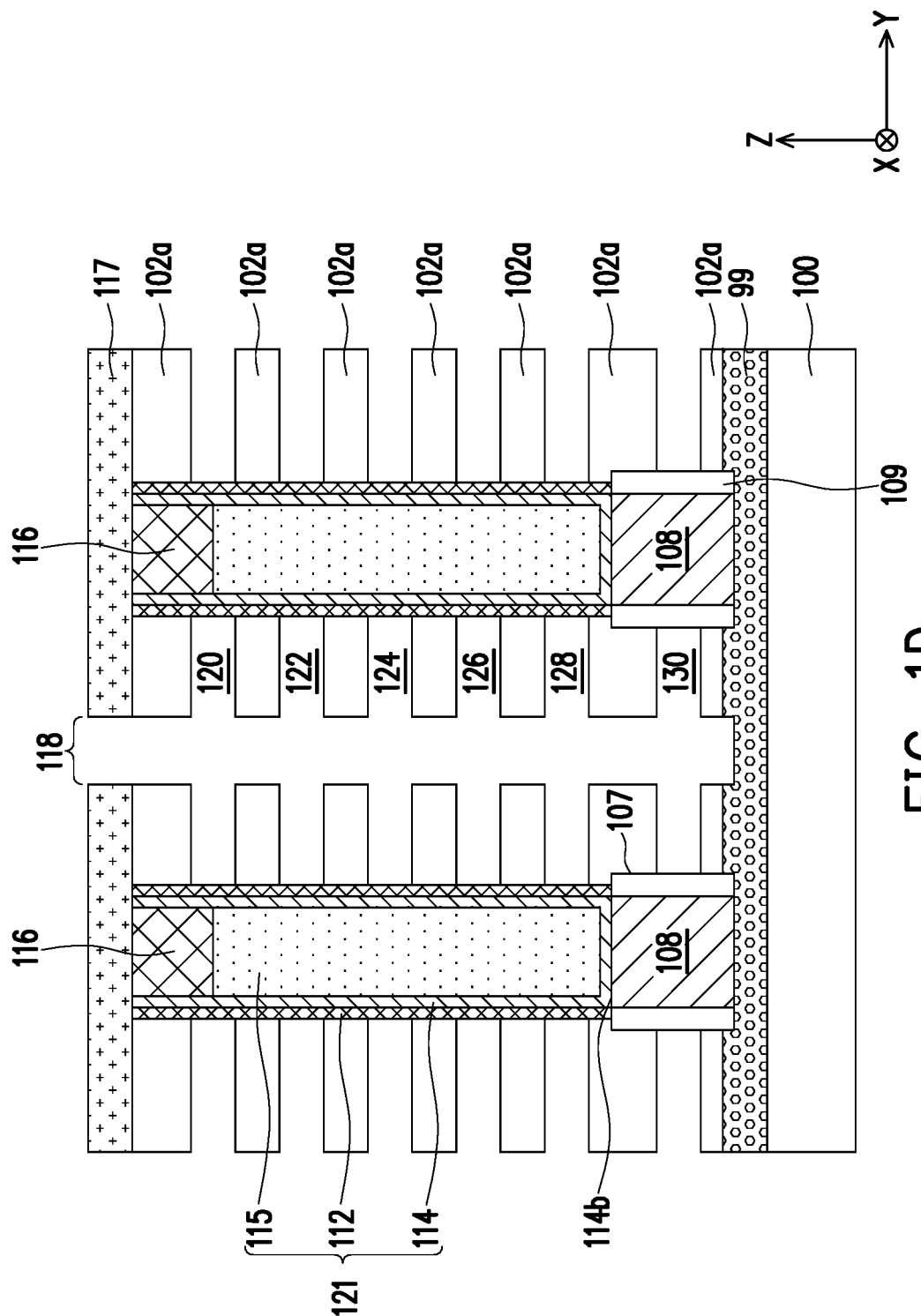

Referring to FIG. 1D, a patterning process is performed on the insulating layer 117 and the stacked structure 101 to form an opening (also referred to as a trench) 118 penetrating through the insulating layer 117, the insulating material layers 102, and the sacrifice layers 104. In some embodiments, in the patterning process, a portion of the substrate 100 may meanwhile be removed such that the opening 118 exposes the doped region 99 in the substrate 100. Moreover, after performing the patterning process on the insulating material layers 102, the remaining portion of the insulating material layers 102 forms insulating layers 102a.

Then, the sacrifice layers 104 exposed by the opening 118 are removed to form lateral openings 120, 122, 124, 126, 128, and 130 exposing a portion of the charge storage structure 112 and the insulating layers 102a. The method of removing the sacrifice layers 104 exposed by the opening 118 is, for example, a dry etching process or a wet etching process. The etchant used in the dry etching process is, for example, $NF_3$, $H_2$, HBr, $O_2$, $N_2$, He or a combination thereof. The etchant used in the wet etching process is, for example, a $H_3PO_4$ solution.

Figure 1E:
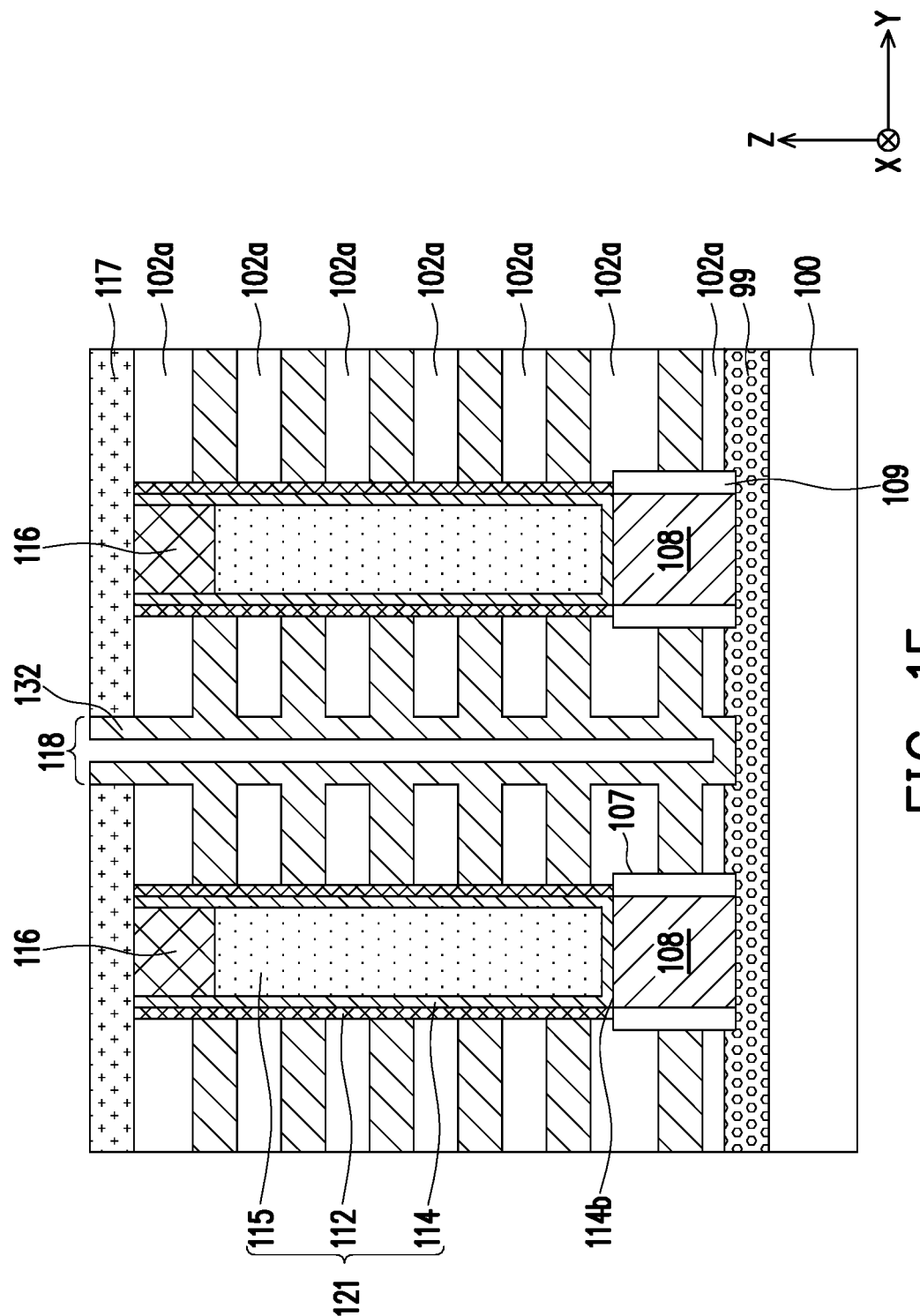

Referring to FIG. 1E, a surface processing process is performed to form an insulating layer 109 on the surface of the conductive plug 108 exposed from the lateral opening 130. The surface processing process is, for example, a thermal oxidation process. The insulating layer 109 is, for example, a silicon oxide layer. Afterwards, a gate electrode layer 132 is filled on the surface of the opening 118 and in the lateral openings 120, 122, 124, 126, 128, and 130. The gate electrode layer 132 may include a buffer material layer, a barrier material layer, and a gate conductive material layer which are sequentially formed. The buffer material layer is formed between the barrier material layer and the charge storage structure and on the surfaces of the insulating layers 102a. The material of the buffer material layer is, for example, a high-k material having a dielectric constant greater than 7, such as $Al_2O_3$, $HfO_2$, $La_2O_5$, a transition metal oxide, a lanthanide series oxide, or a combination thereof. The method of forming the buffer material layer is, for example, a chemical vapor deposition process or an atomic layer deposition (ALD) process. The buffer material layer may improve the erasing and programming properties. The material of the barrier material layer is, for example, Ti, TiN, Ta, TaN, or a combination thereof. The barrier material layer is located between the buffer material layer and the gate conductive material layer. The method of forming the barrier material layer is, for example, a chemical vapor deposition process. The material of the gate conductive material layer is, for example, polysilicon, amorphous silicon, W, Co, Al, $WSi_x$, or $CoSi_x$. The method of forming the gate conductive material layer is, for example, a chemical vapor deposition process.

Figure 1F:
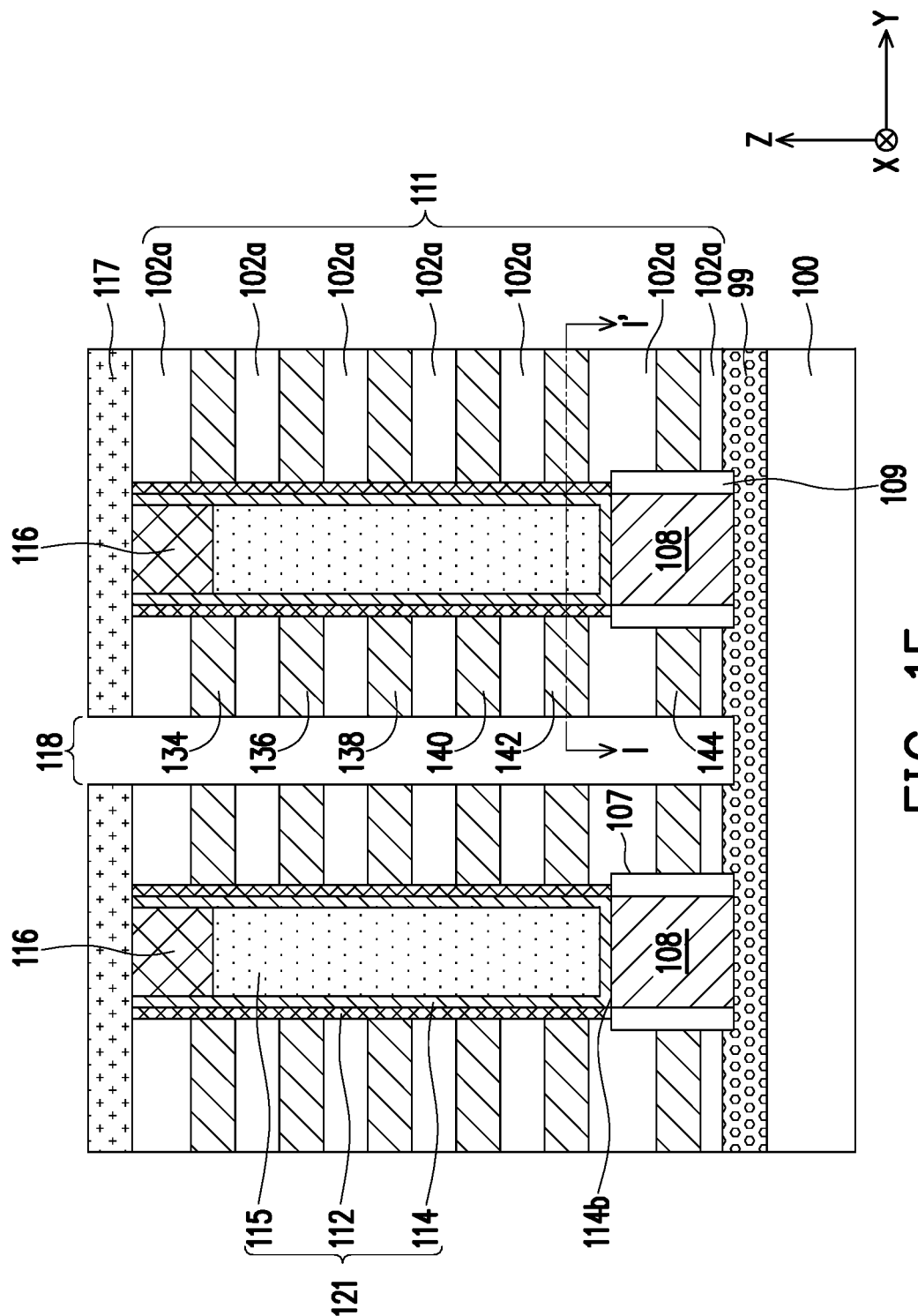

Referring to FIG. 1E, FIG. 1F, and FIG. 3G, an etching process is performed to remove a portion of the gate electrode layer 132, leaving gate electrode layers 134, 136, 138, 140, 142, and 144 located in the lateral openings 120, 122, 124, 126, 128, and 130. The etching process may be a single etching process or multiple etching processes. The etching process may be a wet etching process or a dry etching process. The gate electrode layers 134, 136, 138, 140, 142, and 144 and the plurality of insulating layers 102a form a multi-layer structure 111 which are alternately stacked. In some embodiments, the gate electrode layer 134 may serve as a string select line (SSL). The gate electrode layers 136, 138, 140, and 142 may serve as word lines (WL). The gate electrode layer 144 may serve as a ground select line (GSL).

Figure 1G:
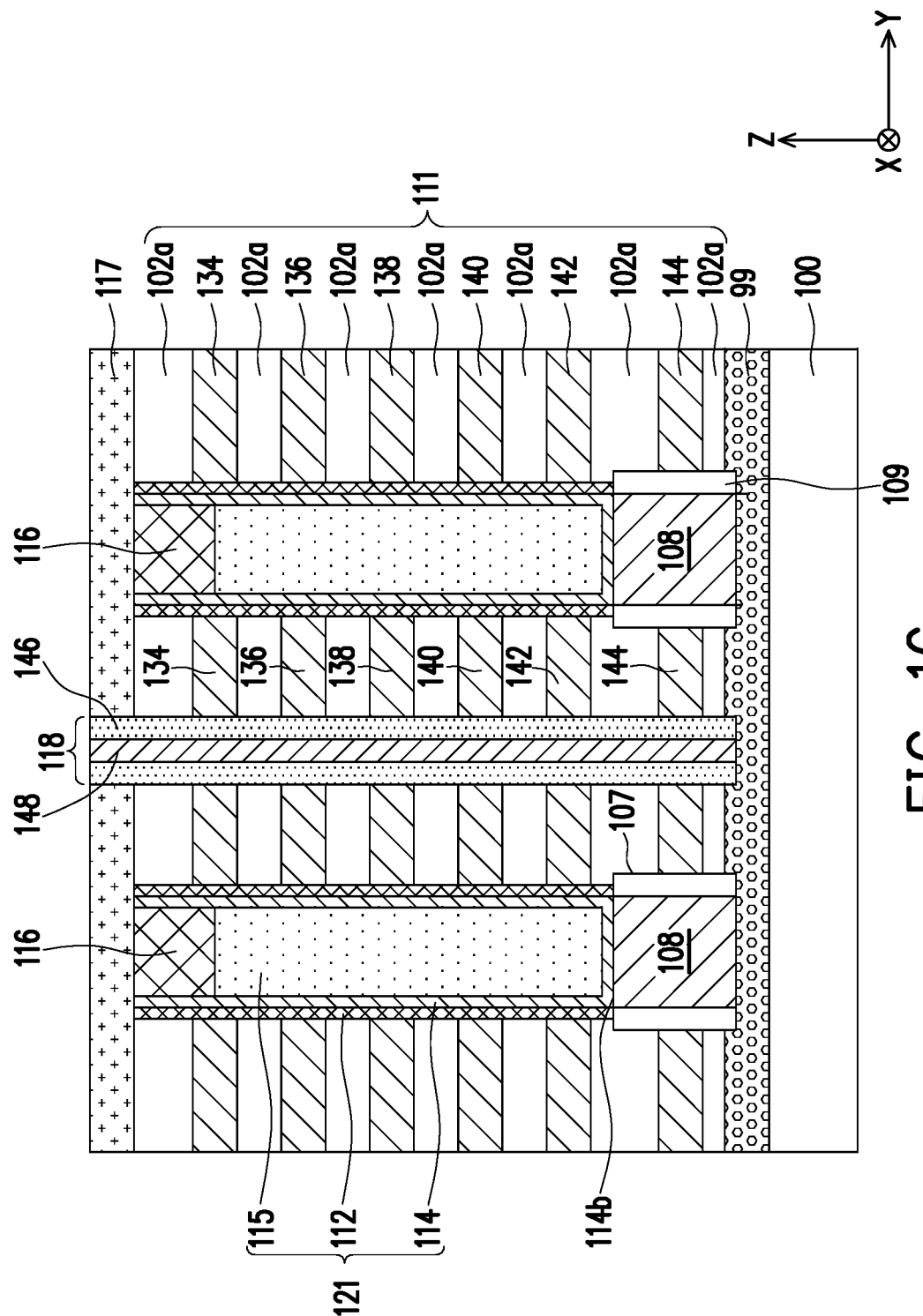

Referring to FIG. 1G, an insulating layer 146 is formed in the opening 118. In some embodiments, the material of the insulating layer 146 is, for example, silicon oxide. The insulating layer 146 is formed by, for example, depositing an insulating material layer by a chemical vapor deposition process or an atomic layer deposition (ALD) process. Next, an anisotropic etching process is performed to remove the insulating material layer at the bottom of the opening 118.

Next, a conductor layer 148 is filled in the opening 118. The conductor layer 148 may include a barrier layer and a metal layer. The material of the barrier layer is, for example, Ti, TiN, Ta, TaN, or a combination thereof. The method of forming the barrier layer is, for example, a chemical vapor deposition process. The material of the metal layer is, for example, W, polysilicon, Co, $WSi_x$, or $CoSi_x$. The method of forming the metal layer is, for example, a chemical vapor deposition process. In some embodiments, the conductor layer 148 may serve as a common source line. At this time, the fabrication of the three-dimensional non-volatile memory of the disclosure has been completed.

Referring to FIG. 1G, a non-volatile memory having a gate all around thin film transistor includes a multi-layer structure 111, an elongated plug structure 121, a conductive plug 108, and a conductive plug 116. The multi-layer structure 111 includes a plurality of gate electrode layers 134, 136, 138, 140, 142, and 144 stacked on a substrate 100 and separated from each other by an insulating layer 120a.

The multi-layer structure 111 has a hole 106 therein. The hole 106 penetrates through the multi-layer structure 111. A cross-section of the hole 106 has an elongated contour (as shown in FIG. 3E). The elongated contour has a long side LLA3 and a short side LSA3 of different lengths. The elongated plug structure 121 is disposed in the hole 106. A cross-section of the elongated plug structure 121 has the elongated contour (as shown in FIG. 3G). The elongated plug structure 121 includes an insulating pillar 115, a channel layer 114, and a gate dielectric layer 112. The insulating pillar 115 is disposed on the substrate 100. The channel layer 114 is disposed on the substrate 100 and surrounds the insulating pillar 115. The gate dielectric layer 112 surrounds the channel layer 114. The gate electrode layers 132, 134, 136, 138, 140, 142, and 144 surround the gate dielectric layer 112. The conductive plug 108 is disposed between the channel layer 114 and the substrate 100 and between the insulating pillar 115 and the substrate 100. The conductive plug 116 is disposed on the insulating pillar 115 and is covered by the channel layer 114.

The elongated contour satisfies Formula 1:

$$A0<A1 \leq A2 \quad \text{<Formula 1>}$$

wherein

A1 represents an area enclosed by the elongated contour,

A2 represents an area of a reference rectangle which has the long side LA3 and the short side SA3, and A0 represents an area of a maximum inscribed ellipse of the reference rectangle.

In some embodiments, the ratio of A1/A2 is in the range of 0.8 to 1. In other embodiments, the ratio of A1/A2 is in the range of 0.9 and 1. Moreover, a corner C of the outer contour of the gate dielectric layer (charge storage layer) 112 may be a round angle, a chamfer angle, or a right angle.

Although the method of manufacturing the three-dimensional non-volatile memory of the present embodiment has been described with the above method as an example, the method of forming the three-dimensional non-volatile memory of the disclosure is not limited thereto.

Figure 6:
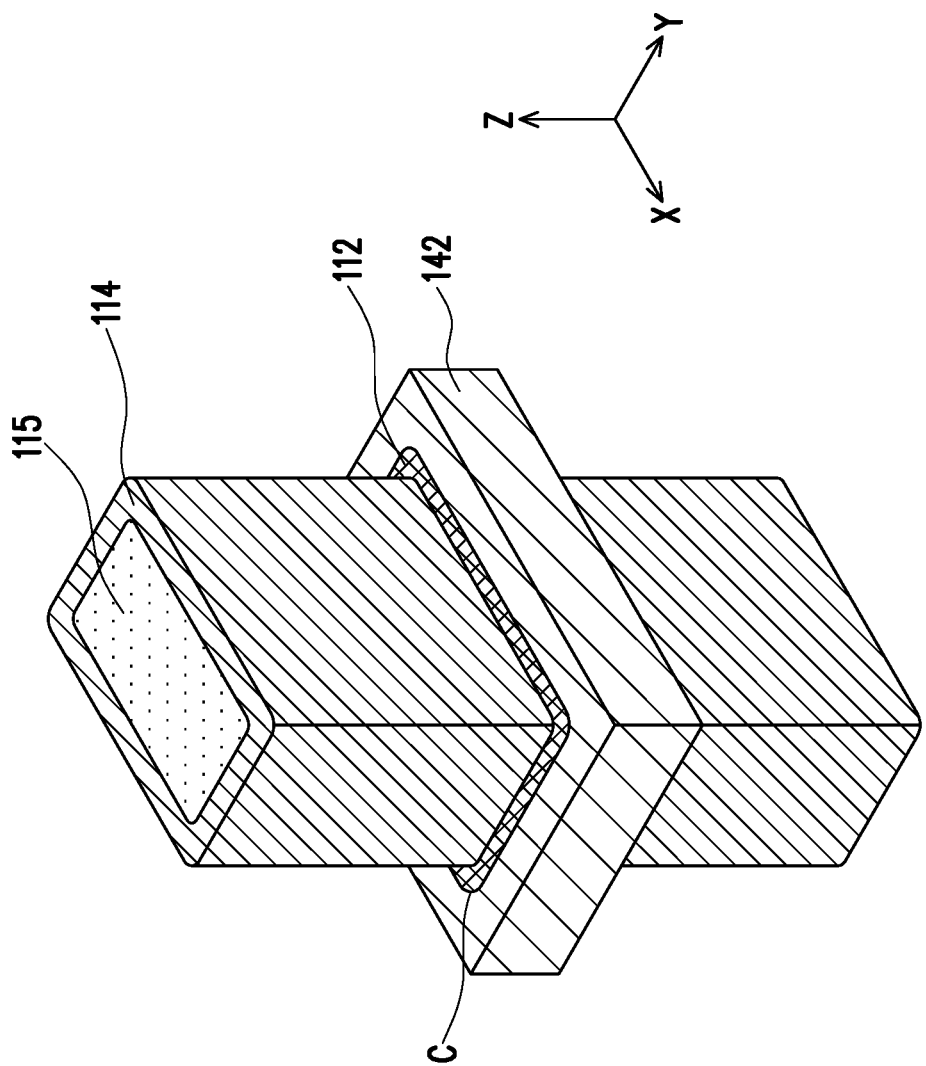
FIG. 6 is a perspective view showing an elongated gate all around structure according to an embodiment of the disclosure.

Referring to FIG. 6, a three-dimensional non-volatile memory of the embodiment of the disclosure has an elongated gate all around thin film transistor structure. The elongated gate all around structure includes a dielectric layer (also referred to as an insulating pillar) 115, a channel layer 114, a charge storage layer (also referred to as a gate dielectric layer) 112, and a gate electrode layer 142. The insulating pillar 115 is disposed on the substrate along the Z-axis direction. The Z-axis direction is parallel to the normal line of the surface of the substrate. A cross-section of the insulating pillar 115 may be in an elongated shape. The channel layer 114 surrounds the sidewall of the insulating pillar 115. The gate dielectric layer (charge storage layer) 112 is located between the gate electrode layer 142 and the channel layer 114. The gate electrode layer 142 surrounds the insulating pillar 115. Cross-sections of the channel layer 114, the gate dielectric layer (charge storage layer) 112, and the gate electrode layer 142 are respectively in the shape of an elongated ring.

Although the above embodiment of the disclosure has been described with a 3D NAND flash memory as an example, the cycle etching process of the elongated hole having a high aspect ratio of the embodiment of the disclosure is also applicable to a ROM/NOR flash memory/Ultra-ROM manufacturing process.

In summary of the above, in the above embodiments, the mask layer having an elliptical opening pattern is used as a mask, and through the control of the cycle etching process, an opening having a cross-section of an elongated contour may be formed in the stacked structure. Accordingly, the charge storage layer may be constructed to have a cross-section of an elongated contour. The charge storage layer having elongated corners can improve the electric field enhancement effect of the transistor. As a result, it is possible to increase the programming and erasing window and narrow the distribution of the threshold voltage (Vt).

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a non-volatile memory having a gate all around thin film transistor, comprising:
    forming a stacked structure on a substrate;
    forming a mask layer on the stacked structure, wherein the mask layer has a first opening having a cross-section of an elliptical shape;
    performing a plurality of cycle etching processes on the stacked structure with the mask layer as an etching mask to form a second opening of a cross-section having an elongated contour, wherein the elongated contour has a long side and a short side of different lengths, and performing each cycle etching process comprises:
    performing an etching process, comprising:
        performing a first-stage etching process on the stacked structure to form a first hole in the stacked structure, and forming a polymer on a sidewall and a bottom surface of the first hole, wherein in the first-stage etching process, a thickness of the polymer formed at the sidewall of a short-side position of the first hole is greater than a thickness of the polymer formed at the sidewall of a long-side position of the first hole; and
        performing a second-stage etching process on the first hole to form a second hole, wherein a short-side length of the second hole is greater than a short-side length of the first hole; and
    performing a cleaning process to remove the polymer on a bottom surface of the second hole.

2. The method of manufacturing a non-volatile memory having a gate all around thin film transistor according to claim 1, wherein during the performing the second-stage etching process on the first hole, the sidewall of the short-side position of the first hole is covered by the polymer.

3. The method of manufacturing a non-volatile memory having a gate all around thin film transistor according to claim 1, wherein a thickness of the polymer formed in the first-stage etching process is in a gradient decrease from the sidewall of a short-side position of the first hole to the sidewall of a long-side position of the first hole.

4. The method of manufacturing a non-volatile memory having a gate all around thin film transistor according to claim 1, wherein a difference between a short-side length of the second hole and a short-side length of the first hole is greater than a difference between a long-side length of the second hole and a long-side length of the first hole.

5. The method of manufacturing a non-volatile memory having a gate all around thin film transistor according to claim 1, wherein an etching gas used in the first-stage etching process comprises a first hydrocarbon, and an etching gas used in the second-stage etching process comprises a second hydrocarbon, wherein a carbon number of the first hydrocarbon is greater than a carbon number of the second hydrocarbon.

6. The method of manufacturing a non-volatile memory having a gate all around thin film transistor according to claim 5, wherein a time for the performing the second-stage etching process on the first hole is greater than a time for the performing the first-stage etching process on the stacked structure.

7. The method of manufacturing a non-volatile memory having a gate all around thin film transistor according to claim 1, wherein the plurality of cycle etching processes are performed for 6 to 50 cycles.

8. The method of manufacturing a non-volatile memory having a gate all around thin film transistor according to claim 1, wherein the second opening having the elongated contour satisfies Formula 1:

$$A0 < A1 \leq A2 \qquad <\text{Formula 1}>$$

wherein

A1 represents an area enclosed by the elongated contour, and

A2 represents an area of a reference rectangle which has the long side and the short side, and A0 represents an area of a maximum inscribed ellipse of the reference rectangle.

9. The method of manufacturing a non-volatile memory having a gate all around thin film transistor according to claim 8, wherein a ratio of A1/A2 is in a range of 0.9 to 1.

10. The method of manufacturing a non-volatile memory having a gate all around thin film transistor according to claim 1, further comprising:
forming a charge storage layer on a sidewall of the second opening;
forming a channel layer in the second opening, wherein the charge storage layer surrounds the channel layer; and
forming an insulating pillar in the second opening, wherein a portion of the channel layer surrounds the insulating pillar.

11. The method of manufacturing a non-volatile memory having a gate all around thin film transistor according to claim 10, further comprising:
after forming the charge storage layer on the sidewall of the second opening and before forming the channel layer, removing a portion of the stacked structure under the second opening to form a first contact opening exposing the substrate;
forming a first conductive plug in the first contact opening; and
forming a second conductive plug on the insulating pillar, wherein another portion of the channel layer surrounds the second conductive plug.

12. The method of manufacturing a non-volatile memory having a gate all around thin film transistor according to claim 11, wherein the stacked structure comprises a plurality of insulating material layers and a plurality of sacrifice layers which are alternately stacked.

13. The method of manufacturing a non-volatile memory having a gate all around thin film transistor according to claim 12, further comprising:
forming a trench in the stacked structure to expose the plurality of insulating material layers and the plurality of sacrifice layers;
removing the plurality of sacrifice layers to form a plurality of lateral openings; and
forming a plurality of gate electrode layers in the plurality of lateral openings.

* * * * *